United States Patent
Wang et al.

(10) Patent No.: US 7,089,137 B2
(45) Date of Patent: Aug. 8, 2006

(54) UNIVERSAL TEST PLATFORM AND TEST METHOD FOR LATCH-UP

(75) Inventors: Jie-Hong Wang, Tao-Yuan Hsien (TW); Kai-Jen Ko, Hsin-Chu (TW); An-Ru Cheng, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 167 days.

(21) Appl. No.: 10/709,425

(22) Filed: May 5, 2004

(65) Prior Publication Data

US 2005/0049812 A1  Mar. 3, 2005

(30) Foreign Application Priority Data

Sep. 1, 2003   (TW) ............... 92124134 A

(51) Int. Cl.
*G01R 31/14*   (2006.01)

(52) U.S. Cl. ...................... 702/117; 324/765

(58) Field of Classification Search ............ 702/57–59, 702/64, 69, 117, 118, 119, 120–123, 183, 702/184, 193; 714/738, 744; 324/76.11, 324/158.1, 765
See application file for complete search history.

(56) References Cited

U.S. PATENT DOCUMENTS

| | | | | |
|---|---|---|---|---|
| 5,377,203 A | * | 12/1994 | Khan | 714/744 |
| 5,623,202 A | * | 4/1997 | Yung | 324/158.1 |
| 6,028,438 A | * | 2/2000 | Gillette | 324/765 |
| 6,393,593 B1 | * | 5/2002 | Tsujii | 714/738 |
| 6,429,676 B1 | * | 8/2002 | Chun et al. | 324/765 |
| 6,586,921 B1 | * | 7/2003 | Sunter | 324/76.11 |
| 6,940,271 B1 | * | 9/2005 | West | 324/158.1 |

* cited by examiner

*Primary Examiner*—Marc S. Hoff
*Assistant Examiner*—Mohamed Charioui
(74) *Attorney, Agent, or Firm*—Winston Hsu

(57) ABSTRACT

A method for testing latch-up phenomenon of a chip is provided. The chip is tested on a test platform, the test platform storing a test program of the chip for testing the chip. The method includes (a) obtaining the test program of the chip tested on the test platform, (b) obtaining pin data of the chip by the test program of the chip, (c) setting up an input pin of the chip with an initial value, and (d) providing a test current to the pin of the chip, and then measuring the current between a power end and a ground end of the chip to see if it exceeds a first predetermined value.

8 Claims, 5 Drawing Sheets

```
GetDevPath(device_path)
```
~40

```
strcat(device_path,"/user_proc/latchup/IO. pin");
if ((file_id_1 =fopen(device_path,"r")) == NULL) {
fprintf(stderr," IO. pin does not existed !!\n");
fclose(file_id_1);SetSystemFlag(CI_ABORT, 1);
*state_out = CI_CALL_ERROR;}
```
~42

```
sprintf(task_string,"DFCM 1,%f,,,
-30000.000,30000.000,30000.000,,5.000,PPNP,(ALL_IN)
\n", 0.000);fw_task();
sprintf(task_string,"PTST?1,,,PVAL \n");fw_task();
sprintf(task_string,"RLYC PPMU,PMU,(ALL_IN)\n");
fw_task();idd();
```
~44

```
while (fscanf(file_id_1,"%s", pin) == 1){Current=25000;for(k=
0;k<8;k++){sprintf(task_string,"DFVM 1,%d,%d,
4500.0,1000.0,3000.0,,5.0,SPNS,(%s)\n)while (fscanf(file_id_2,"
%s", pwd)==1){sprintf(task_string,"IDDQ?VAL,
-2,10.000000,,0,(%s) \n", pwd);if(abs(idd_diff) > 10000){
fprintf(stderr,"Shooting at pin %10s with current %10d
uAdamage chip\n", pin,Current);}}
```
~46

```
while (fscanf(file_id_2,"%s", pwd) == 1){
sprintf(task_string,"IDDQ? VAL,
-2,10.000000,,0,(%s) \n", pwd);idd_init[pwd_cnt
]=idd_bef;}
```
~48

Fig. 5

UNIVERSAL TEST PLATFORM AND TEST METHOD FOR LATCH-UP

BACKGROUND OF INVENTION

1. Field of the Invention

The invention relates to a universal test platform and related test method for latch-up, and more particularly, to a universal test platform and related test method for latch-up implemented by a test platform for developing a chip.

2. Description of the Prior Art

Please refer to FIG. 1 showing a cross-sectional view of a conventional CMOS and its associated parasitic circuit. In an integrated circuit (IC) two problems may occur: either a short circuit between a drain voltage node (VDD) and a source voltage node (VSS) may be formed due to a parasitic circuit effect, or the circuit cannot normally operate due to sudden voltage change when the power is off. Such kind of influence by a parasitic circuit is called a latch-up phenomenon. When a large amount of electrons is injected into an N-type substrate and received by a P-type well, the voltage drop between parasitic resistors Rs and Rw caused by a large current formed by the electrons is sufficient to conduct a low voltage in equivalent transistors T1, T2, resulting in a short circuit between VDD and VSS so that latch-up phenomenon occurs and the system fails. In order to prevent system failure due to latch-up, the resistance of the parasitic resistors Rs, Rw need to be lowered or the gain constant of the equivalent transistors be reduced. The gain constant of the equivalent transistors can be reduced by improving the IC manufacturing process. In addition, connecting the base of an N-type field transistor to the source voltage node can reduce the resistance of the parasitic resistors Rs, Rw, so that latch-up phenomenon is less possible to occur.

Please refer to FIG. 2 showing a conventional method for testing latch-up phenomenon in an IC 10. During the test, a test voltage 12 and an ammeter 14 is first installed between a power end (Vs) and a ground end (GND), and a trigger current 16 is then applied between a pin under test (PUT) and GND so that the ammeter 14 measures a current between Vs and GND. If latch-up phenomenon does not occur, the trigger current 16 is increased to continue the test. Such kind of latch-up test is standardized by JEDEC EIA/JESD78, in which each pin is required to sustain a trigger current 16 of 200 mA. The trigger current 16 increases 25 mA each time starting from 25 mA, and during the test the current measured between Vs and GND cannot exceed 100 mA. Generally, each different IC has its own test platform for developing and testing its functions. The test platform provides a parameter measurement unit (PMU), which is a set of power supplies providing current source and voltage source, as well as a set of units for measuring current and voltage. It is easy to execute latch-up test by PMU. Therefore, IC makers develop test programs on a test platform for different types of ICs according to JEDEC EIA/JESD78, to ensure that each IC passes the latch-up test.

As described above, latch-up phenomenon due to the parasitic circuit of the IC itself causes malfunction of the circuit system; thus each IC is required to pass the latch-up test by complying with the JEDEC EIA/JESD78 standard to ensure that the system operates normally. Since different ICs have their own test platforms, the IC makers can develop test programs on the test platforms for different types of ICs according to JEDEC EIA/JESD78 standard. However, it is troublesome to develop test programs for every different IC, since there are various types of ICs.

SUMMARY OF INVENTION

It is therefore a primary objective of the claimed invention to provide a universal test platform and related test method for latch-up, in order to solve the problems mentioned above.

Briefly, a method for testing latch-up phenomenon of a chip is provided. The chip is tested on a test platform, the test platform storing a test program of the chip for testing the chip. The method includes (a) obtaining the test program of the chip tested on the test platform, (b) obtaining pin data of the chip by the test program of the chip, (c) setting up an input pin of the chip with an initial value, and (d) providing a test current to the pin of the chip, and then measuring the current between a power end and a ground end of the chip to see if it exceeds a first predetermined value.

The present invention further provides a test platform for testing latch-up phenomenon of a chip comprising a memory, a parameter measurement unit (PMU) for providing a current source to the chip and measuring the current between a power end and a ground end of the chip, a latch-up test program stored in the memory, and a processor for executing programs stored in the memory. The latch-up test program includes a path setup program code for obtaining a test program of the chip, a pin setup program code for obtaining a pin of the chip by the test program of the chip, an initial setup program code for setting the input pin of the chip with an initial value, a current measuring setup program code for driving the PMU to measure the current between the power end and the ground end of the chip, and a current providing setup program code for driving the PMU to provide a test current to the pin of the chip.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5 is a latch-up test program 30 according to the present invention.

DETAILED DESCRIPTION

Figure 1:
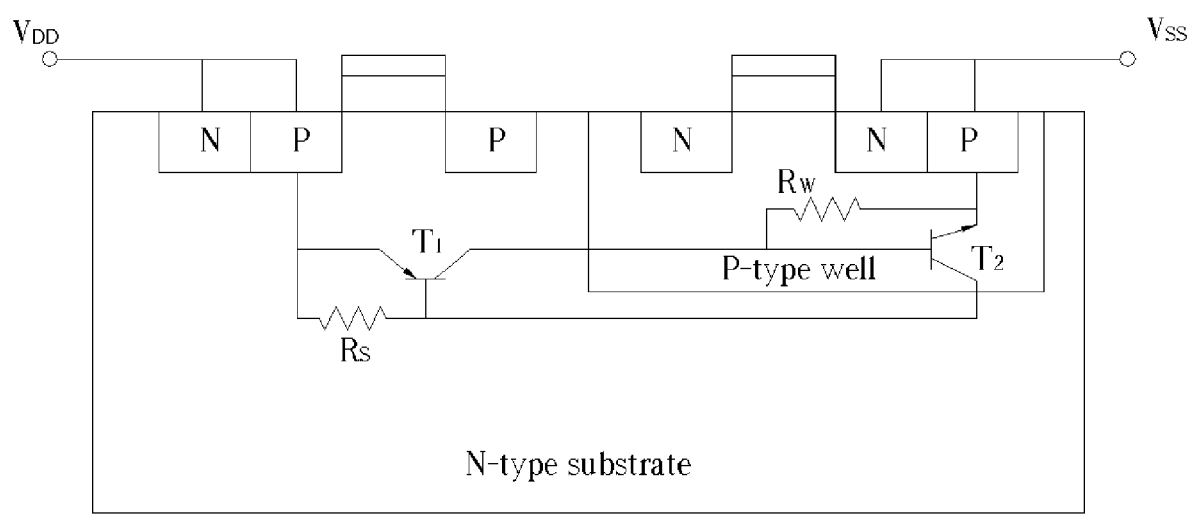
FIG. 1 is a cross-sectional view of a conventional CMOS and its associated parasitic circuit.
Figure 2:
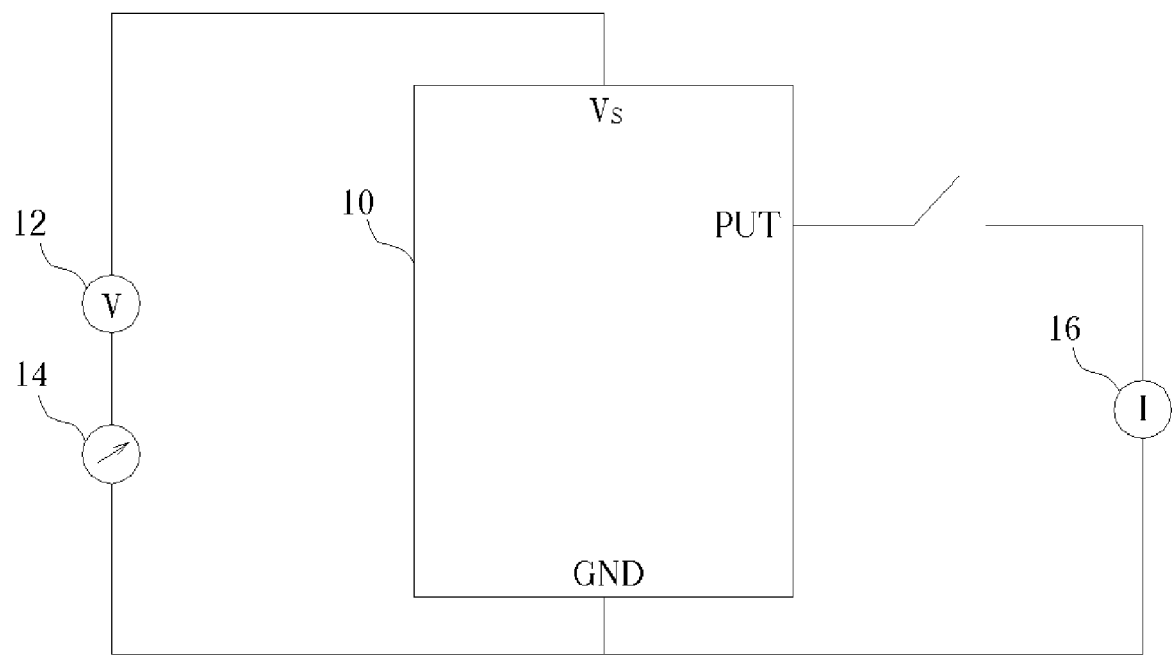
FIG. 2 illustrates a conventional method for testing the latch-up phenomenon of an IC.
Figure 3:
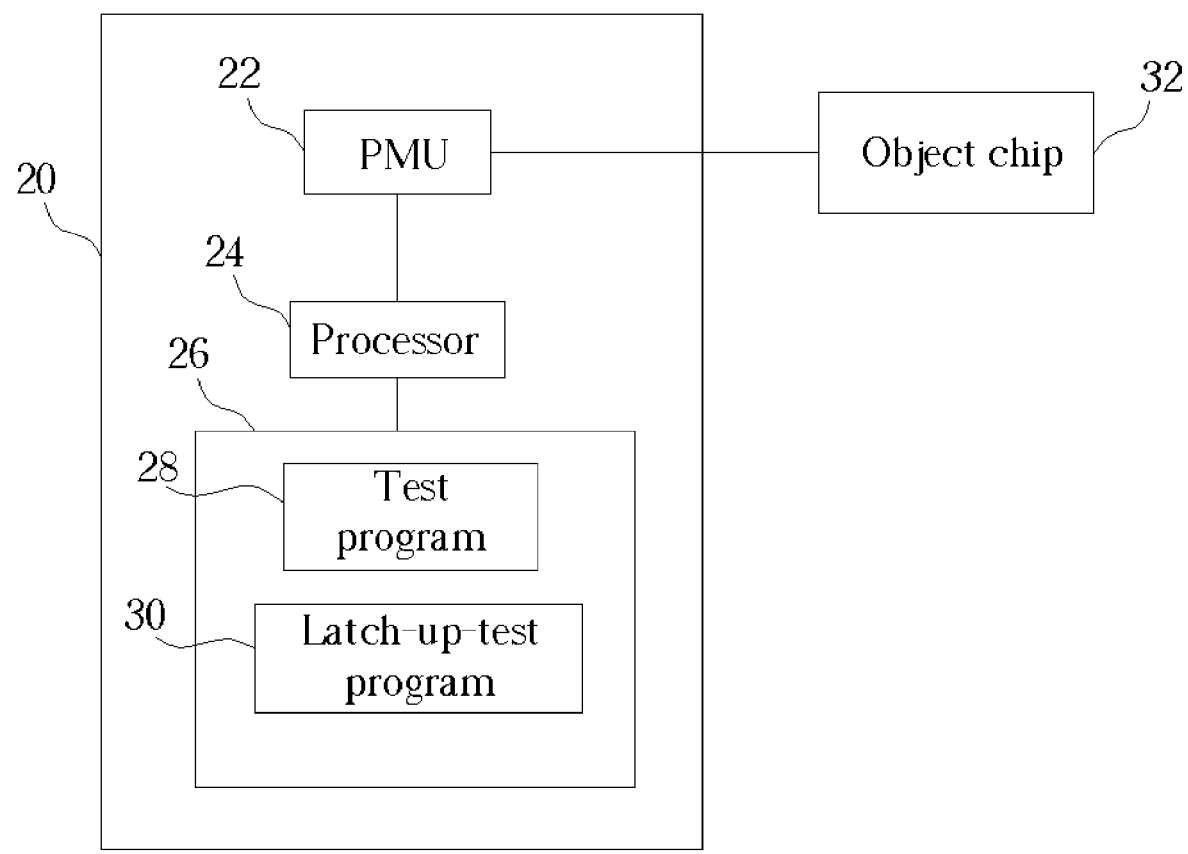
FIG. 3 is a block diagram of a test platform according to the present invention.

Please refer to FIG. 3 showing a block diagram of a test platform 20 according to the present invention. The test platform 20 includes a processor 24, a memory 26 storing a test program 28 and a latch-up test program 30, and a PMU 22. During the test, an object chip 32 to be tested is first connected to the PMU 22. The PMU 22 provides a current source to the chip 32 and measures the current between a power end and a ground end of the chip 32. Then the processor 24 executes the latch-up test program 30 on the chip 32.

In general, the platform 20 is for developing chips with different functions, and the test program 28 is used to execute function tests on a chip developed on the test platform 20. Therefore, a chip developed on the test platform 20 has its own test program 28 stored onto the test platform 20, which includes functions for testing the chip as well as I/O pin data of the chip. Since, the object chip 32 is a chip developed on the test platform 20, a test program 28 of the object chip 32 is on the test platform 20. If only the I/O pin data of the object chip 32 needs to be obtained, latch-up test on the object chip 32 can easily proceed. The present invention uses the test program 28, stored after developing the object chip 32 on the test platform 20, to obtain the I/O pin data of the object chip 32. In this way, the test platform 20 does not need to develop a latch-up test program 30 for each different chip 32 but can use only one latch-up test program 30 to execute a latch-up test for different chips 32 because the I/O pin data of the object chip 32 is already stored in the test platform 20.

Figure 4:
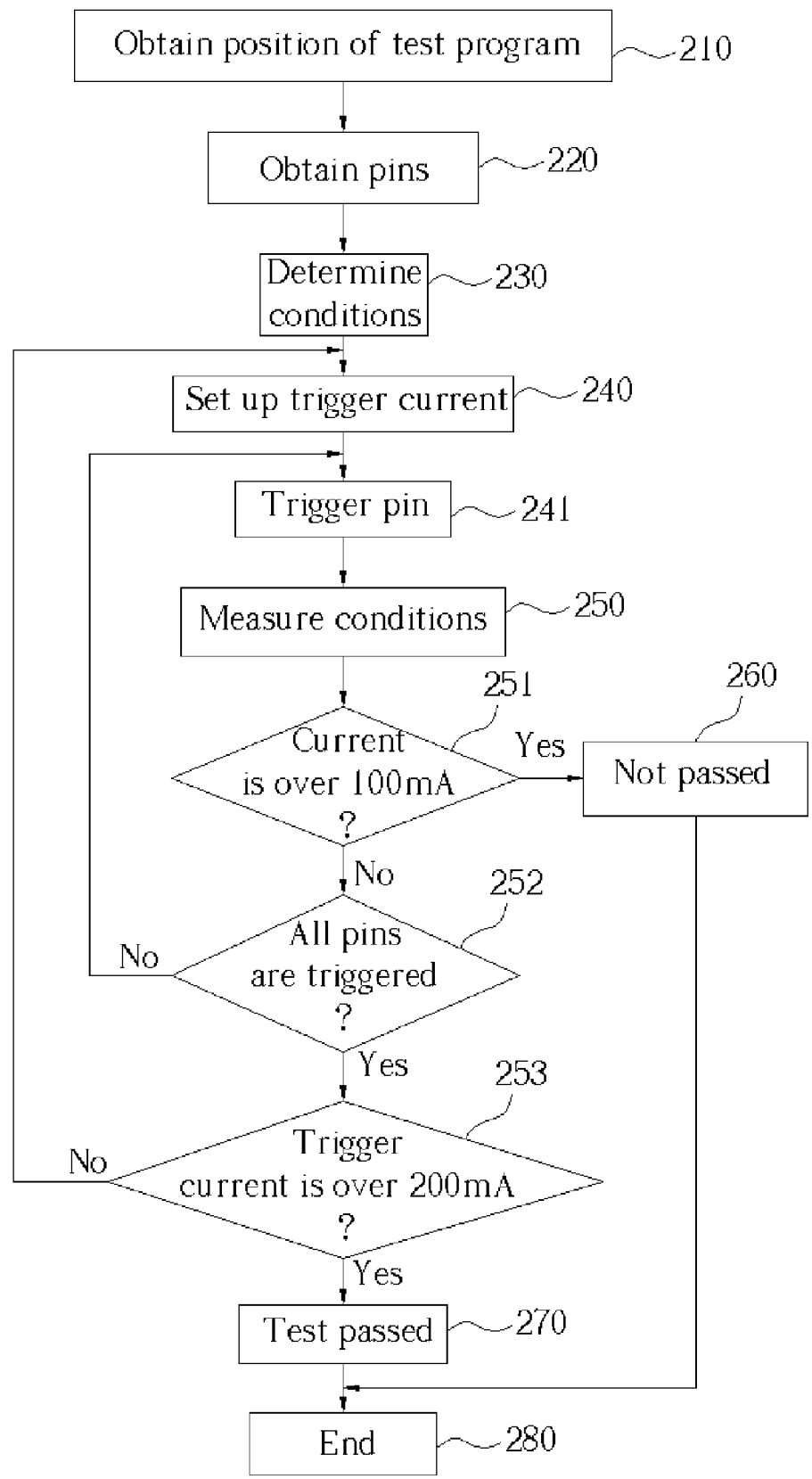
FIG. 4 is a flowchart of a latch-up test done by the test platform 20 according to the present invention.

Please refer to FIG. 4 showing a flowchart of a latch-up test done by the test platform 20 according to the present invention. During the test, an object chip 32 to be tested is connected to the PMU 22. The PMU 22 provides a current source to the chip 32 and measures the current between a power end and a ground end of the chip 32. Then the processor 24 executes the latch-up test program 30 on the chip 32 as follows:

Step 210: Obtain the test program 28 of the object chip 32 on the test platform 20.

Step 220: Obtain the power end and all the I/O pins of the object chip 32 with the test program 28.

Step 230: Determine the conditions of all the I/O pins, that is set up the initial values of the I/O pins as 1 or 0.

Step 240: Set up a current value (XmA) of a trigger current. The first time through the initial value of the trigger current is set up as 25 mA.

Step 241: Apply the trigger current between a PUT and the ground end of the object chip 32.

Step 250: Measure the current between the power end and the ground end of the object chip 32.

Step 251: See if the current between the power end and the ground end of the object chip 32 is over 100 mA. If yes, proceed to Step 260; if no, proceed to Step 252.

Step 252: See if the trigger current is applied between all the pins and the ground end. If yes, proceed Step 253; if no, return to Step 241 to test the next PUT of the object chip 32.

Step 253: See if the trigger current is over 200 mA. If yes, proceed to Step 270; if no, return to Step 240 to set up the trigger count by adding another 25 mA to the trigger current. In other words, set up the trigger current as (X+25)mA and repeat the steps on the test.

Step 260: Latch-up phenomenon occurs, the object chip 32 does not pass the test of the latch-up test program 30. Go to Step 280.

Step 270: The object chip 32 passes the test by the latch-up test program 30.

Step 280: Finish the latch-up test program 30 and output the result.

Please refer to FIG. 5 showing the latch-up test program 30 according to the present invention. The latch-up test program 30 is written according to the flowchart shown in FIG. 4, which complies with JEDEC EIA/JESD78 standard. For implementing the steps described above, the latch-up test program 30 includes a path setup program code 40, a pin setup program code 42, an initial setup program code 44, a current providing program code 46, and a current measuring program code 48. The path setup program code 40 is for obtaining the test program of the object chip 32 on the test platform 20 so that the latch-up test program 30 proceeds to Step 210. The pin setup program code 42 obtains the power end and all the I/O pins of the object chip 32 from the test program 28 so that the latch-up test program 30 proceeds to Step 220. The initial setup program code 44 determines the initial values of the I/O pins so that the latch-up test program 30 proceeds to Step 230. The current providing program code 46 drives the PMU 22 to provide the trigger current to the pins of the object chip 32 so that the latch-up test program 30 proceeds to Step 240. The current measuring program code 48 drives the PMU 22 to measure the current between the power end and the ground end of the object chip 32 so that the latch-up test program 30 proceeds to Step 250. An automated test equipment (ATE) provides a window operating interface so that the user only needs to insert the object chip 32 into the ATE and input the path of the latch-up test program 30 through the window operating interface to execute latch-up test on the object chip 32 and output the result after the test to notify which pin does not pass latch-up test.

As described above, whenever developing a chip, there is a test program stored in the test platform. The test program includes the I/O pin data of the chip; therefore when executing a latch-up test on the chip, only one latch-up test program needs to be developed to execute a latch-up test on all kinds of chips on the same platform in cooperation with the I/O pin data, so that the time on developing latch-up test programs is reduced. In addition, since the chip is developed on the test platform, the present invention can be applied in the test after packaging as well as in the wafer test.

In contrast to the prior art, the present invention uses the test program to obtain the I/O pin data during the developing of the chip so that the test platform can use a single latch-up test program to execute a latch-up test to all the chips developed on the same test platform to reduce the time on program development.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test platform for testing latch-up phenomenon of a chip comprising:
   a memory;
   a parameter measurement unit (PMU) for providing a current source to the chip and measuring the current between a power end and a ground end of the chip;
   a latch-up test program stored in the memory comprising:
      a path setup program code for obtaining a test program of the chip;
      a pin setup program code for obtaining a pin of the chip by the test program of the chip;
      an initial setup program code for setting the input pin of the chip with an initial value;
      a current measuring setup program code for driving the PMU to measure the current between the power end and the ground end of the chip to see if the current exceeds a first predetermined value; and
      a current providing setup program code for driving the PMU to provide a test current to the pin of the chip; and
   a processor for executing programs stored in the memory, controlling the PMU to increase the test current between the power end and the ground end of the chip until the test current exceeds a predetermined value, and determining that the chip passes the latch-up test if the test current exceeds the second predetermined value and the current between the power end and the ground end of the chip does not exceed the first predetermined value.

2. The test platform of claim 1 wherein the test program is stored in the memory for testing the chip.

3. The test platform of claim 1 wherein the chip comprises a plurality of I/O pins and a plurality of power pins.

4. The test platform of claim 1 wherein the initial value is 0 or 1.

5. The test platform of claim 1 being an automated test equipment (ATE).

6. A method for testing latch-up phenomenon of a chip, the chip being tested on a test platform, the test platform storing a test program of the chip for testing the chip, the method comprising:
   (a) obtaining the test program of the chip tested on the test platform;
   (b) obtaining pin data of the chip by the test program of the chip;
   (c) setting up an input pin of the chip with an initial value;
   (d) providing a test current to the pin of the chip, and then measuring the current between a power end and a ground end of the chip to see if it exceeds a first predetermined value;
   (e) increasing the test current and repeating step (d) until the test current exceed a second predetermined value; and
   (f) determined that the chip passes the latch-up test if the test current used in step (e) exceeds the second predetermined value and the current between the power end and the second end of the chip does not exceed the first predetermined value.

7. The method of claim 1 wherein Step (d) further comprises providing the test current to each of the pins, and measuring the current between the power end and the ground end of the chip to see if it exceeds the first predetermined value.

8. The method of claim 1 further comprising determining that the chip does not pass the latch-up test if the test current exceeds the first predetermined value.

* * * * *